United States Patent [19]

Vasudev

[11] Patent Number: 4,509,990
[45] Date of Patent: Apr. 9, 1985

[54] SOLID PHASE EPITAXY AND REGROWTH PROCESS WITH CONTROLLED DEFECT DENSITY PROFILING FOR HETEROEPITAXIAL SEMICONDUCTOR ON INSULATOR COMPOSITE SUBSTRATES

[75] Inventor: Prahalad K. Vasudev, Santa Monica, Calif.

[73] Assignee: Hughes Aircraft Company, El Segundo, Calif.

[21] Appl. No.: 441,477

[22] Filed: Nov. 15, 1982

[51] Int. Cl.³ .................. H07L 21/263; H07L 21/225
[52] U.S. Cl. ........................................ 148/1.5; 29/571; 29/576 B; 29/576 T; 148/187; 357/91; 427/53.1
[58] Field of Search ............ 148/1.5, 187; 29/571, 29/576 B, 576 T; 357/91; 427/53.1

[56] References Cited

U.S. PATENT DOCUMENTS

| | | |
|---|---|---|
| 3,393,088 | 7/1968 | Manasevit et al. |
| 3,414,434 | 12/1968 | Manasevit . |
| 3,475,209 | 10/1969 | Manasevit . |
| 3,508,962 | 4/1970 | Manasevit et al. |
| 3,546,036 | 12/1970 | Manasevit . |
| 3,664,866 | 5/1972 | Manasevit . |
| 3,909,307 | 8/1975 | Stein ............... 148/1.5 |
| 4,169,740 | 10/1979 | Kalbitzer et al. ......... 148/1.5 |
| 4,177,084 | 12/1979 | Lau et al. ............ 148/1.5 |
| 4,317,686 | 3/1982 | Anand et al. ............ 148/1.5 |
| 4,385,937 | 5/1983 | Ohmura ................ 148/1.5 |
| 4,391,651 | 7/1983 | Yoder ................ 148/1.5 |

FOREIGN PATENT DOCUMENTS

| | | | |
|---|---|---|---|
| 33821 | 4/1981 | Japan ............... | 148/1.5 |
| 46522 | 4/1981 | Japan ............... | 29/576 W |

OTHER PUBLICATIONS

J. C. Bean et al, "Substrate and Doping Effects Upon Laser-Induced Epitaxy of Amorphous Silicon", Journal of Applied Physics, vol. 50, No. 2, pp. 881–885, Feb. 1979.
Amano et al., J. Crystal Growth, 56, (Jan. 1982), 296.
Fang et al., IBM-TDB, 23, (1980), 362.
Lau et al., Appl. Phys. Lett. 34, (1979), 76.
Duffy et al., Jour. Crystal Growth, 58, (Jun. 1982), 19.
Reedy et al., Jour. Crystal Growth, 58, (Jun. 1982), 53.

Primary Examiner—Upendra Roy
Attorney, Agent, or Firm—G. B. Rosenberg; D. W. Collins; A. W. Karambelas

[57] ABSTRACT

Disclosed is a method of fabricating a semiconductor on insulator composite substrate comprised of a semiconductor layer adjacent an insulator substrate, the defect density profile of the semiconductor layer being low and relatively uniform, a relatively thin region of the semiconductor layer at the semiconductor/insulator interface having a substantially greater defect density. The method comprises the steps of depositing the semiconductor layer adjacent the insulator substrate, amorphizing a buried portion of the semiconductor layer without damaging the insulator substrate such as to release contaminants into the semiconductor layer, recrystallizing the amorphous portion of the semiconductor or layer, removing a portion of the semiconductor layer so as to expose the recrystallized layer, and depositing an additional semiconductor layer on the recrystallized layer to provide an essentially defect free semiconductor layer of any desired thickness. The provision of semiconductor layers formed by either appropriately selecting the depth within the semiconductor layer at which the amorphization occurs and the width of the amorphized region or permitting self-annealing to occur during the amorphization, or both, having a desired high defect density and interposed between the recrystallized layer and the insulator substrate are also disclosed.

23 Claims, 11 Drawing Figures

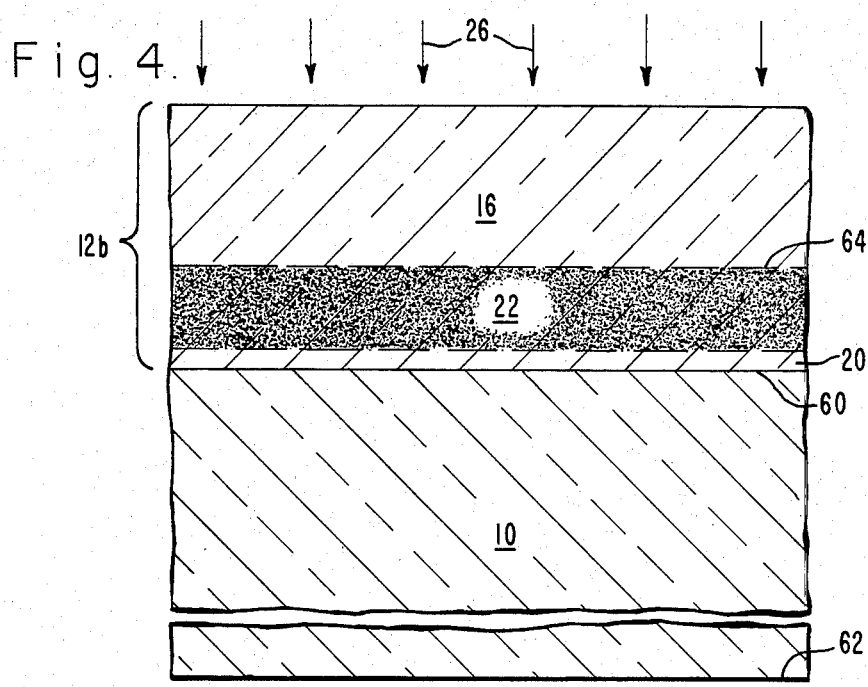
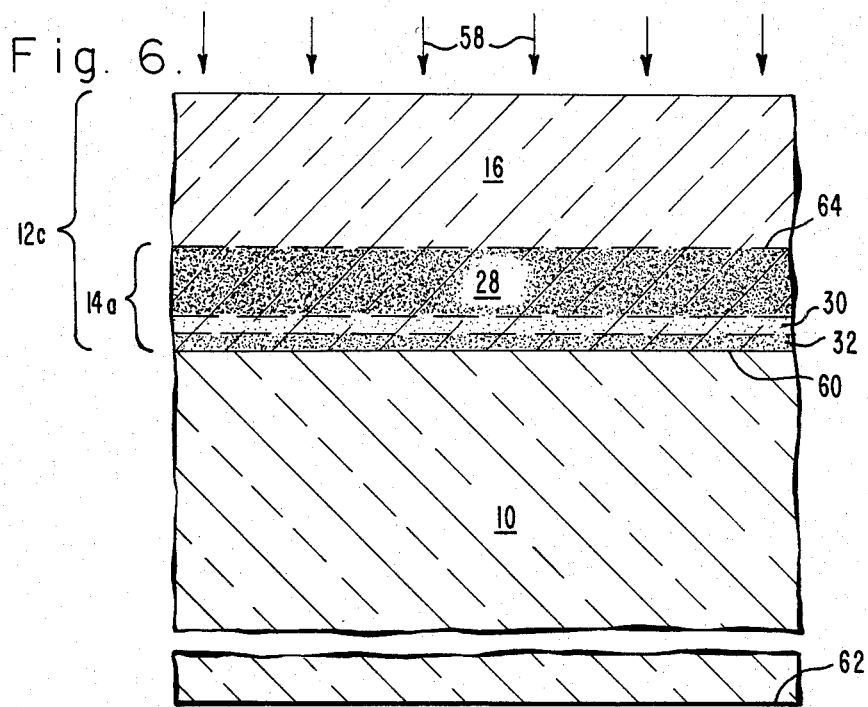

SOLID PHASE EPITAXY AND REGROWTH PROCESS WITH CONTROLLED DEFECT DENSITY PROFILING FOR HETEROEPITAXIAL SEMICONDUCTOR ON INSULATOR COMPOSITE SUBSTRATES

BACKGROUND OF THE INVENTION

1. Field of the Invention

The present invention generally relates to the fabrication of semiconductor-on-insulator composite substrates, such as silicon-on-sapphire (SOS), and, more particularly, to a process of forming a substantially monocrystalline silicon epitaxial layer having a highly controlled defect density profile and containing an extremely low concentration of substrate-originated contaminants, such as aluminum when a sapphire substrate is utilized.

2. Description of the Prior Art

The advantages of utilizing a composite substrate comprised of a monocrystalline semiconductor layer, such a silicon, epitaxially deposited on a supporting insulative substrate are well recognized. These advantages include the substantial reduction of parasitic capacitance between charged active regions and the substrate and the effective elimination of leakage currents flowing between adjacent active devices. This is accomplished by employing as the substrate an insulative material with a high dielectric constant, such as sapphire ($Al_2O_3$), and providing that the conducton path of any interdevice leakage current must pass through the substrate.

At the present, all previous attempts to practically realize an "ideal" silicon-on-insulator composite substrate have been frustrated by a number of significant problems. The simplest "ideal" composite substrate would include a completely monocrystalline, defect-free silicon layer of sufficient thickness to accommodate the fabrication of active devices therein. The silicon layer would be adjacent a highly insulative supporting substrate and would have a minimum of crystal lattice discontinuities at the silicon-substrate interface. As will be explained in greater detail below, a substantially more compex composite substrate, with the silicon layer containing a particular defect density profile, may actually be preferred over the simple "ideal" composite substrate.

Historically, the first significant problem encountered in attempts to fabricate the ideal composite substrate was the substantial incursion of contaminants into an epitaxially deposited silicon layer. In particular, substantial concentrations of aluminum contaminants were found throughout the silicon epitaxial layer when $Al_2O_3$ substrates were used. The inherent consequence of a high concentration of aluminum contaminants, effectively acting as acceptor-type impurities in the silicon epitaxial layer, is that there are unacceptably high leakage currents between the source and drain regions of p-channel active devices, such as MOSFETs (Metal Oxide Semiconductor Field Effect Transistor) and MESFETs (MEtal Semiconductor FET). These leakage currents may be of sufficient magnitude that the p-channel active devices may be considered to be always in an "on", or conducting, state.

The incursion of substrate-originated contaminants into the silicon layer was found to be an inherent consequence of high temperature processing steps. Such steps are typically utilized in both the initial epitaxial deposition of the silicon layer and the subsequent annealing of the silicon layer to reduce crystalline defects contained therein. Thus, principally by trial and error, an approximate temperature of 910° C. has become recognized as the maximum processing temperature that can be utilized without resulting in the substantial incursion of substrate-originated contaminants into the silicon layer.

By effectively precluding the use of high temperature annealing, a second problem was immediately realized. The crystalline quality of the silicon layer, as epitaxially deposited, was of insufficient quality to permit the fabrication of active devices therein. A process known as solid phase epitaxy (SPE) has been recently reported. See, S. S. Lau et al, "Improvement of Crystalline Quality of Epitaxial Si Layers by Ion Implantation Techniques", *Applied Physics Letters,* Vol. 34, No. 1, pp. 76–78, Jan. 1, 1979. The SPE process provides a low temperature subprocess for improving the crystallinity of the silicon epitaxial layer of a silicon-on-sapphire composite substrate. The SPE process involves the high energy implantation (typically at 250 keV to 600 keV) of an ion species, such as silicon, into the silicon epitaxial layer at a sufficient dose to create a substantially amorphous silicon layer lying adjacent the silicon/sapphire interface while leaving a substantially crystalline layer at the surface of the original epitaxial layer. The thickness of the silicon epitaxial layer is substantially that intended for the completed silicon-on-insulator composite substrate (typically 4000 Å or greater). The ion species is implanted through the majority of the epitaxial layer so that the maximum disruption of the silicon crystal lattice is near, but not across, the silicon/sapphire interface to ensure that the amorphous region is adjacent the sapphire substrate. Throughout the ion implantation, the sapphire substrate is maintained at a very low temperature, reported as approximately that of liquid nitrogen (77° K.). A single step low temperature (between 500°–575° C.) annealing of the composite substrate is then performed to convert the amorphous silicon layer into crystalline silicon. During this regrowth, the remaining crystalline surface portion of the silicon layer effectively acts as a nucleation seed so that the regrown portion of the silicon epitaxial layer has a common crystallographic orientation and is substantially free of crystalline defects.

While the SPE process does significantly improve the crystallinity of the silicon epitaxial layer, as a subprocess in the fabrication of silicon-on-insulator composite substrates, it also facilitates the incursion of insulator-originated contaminants into the silicon epitaxial layer. The contaminant concentration resulting from the use of the SPE process is, unfortunately, sufficient to preclude the practical use of integrated circuits fabricated on composite substrates processed with the SPE subprocess. The reasons for the failure of active devices to operate correctly are essentially the same as given above with regard to composite substrates fabricated utilizing high temperature processing steps.

SUMMARY OF THE INVENTION

The general purpose of the present invention, therefore, is to provide a process for fabricating a semiconductor-on-insulator composite substrate wherein the semiconductor layer, such as silicon, has a minimum of crystalline defects and an acceptably low concentration of contaminants while, though not recognized in the prior art, avoiding the problem of damaging the insulator substrate.

This purpose is achieved by the present invention through the formation of an initial semiconductor-on-insulator composite substrate typically comprising a thin silicon layer epitaxially deposited on a surface of an insulative substrate so as to have a given defect density at the silicon/insulator interface, the defect density generally decreasing toward the exposed silicon layer surface and away from the silicon/insulator interface, subsequently performing a low energy ion implantation (less than approximately 90 keV) of a given ion species into the silicon epitaxial layer so as to convert a portion of the epitaxial layer into a buried amorphous silicon layer, twice annealing the composite substrate first so that the amorphous layer regrows from an amorphous/crystal silicon interface (at between 500°–900° C.) and second, to reduce the crystalline defect density throughout the silicon (at up to approximately 910° C.), whereby the regrown crystalline silicon layer is substantially free of defects and, further, is substantially free from insulator-originated contaminants.

An advantage of the present invention is that the contamination of the silicon epitaxial layer by contaminants originating from the insulator substrate can be highly controlled such that there is no significant contamination. In the alternative, a desired optimally small amount of contamination may be allowed to occur, thereby permitting various design parameters, such as radiation hardness, to be chosen without effectively rendering inoperative any active devices fabricated in the silicon epitaxial layer.

Another advantage of the present invention is that the crystalline defect density profile, extending from the exposed silicon epitaxial layer surface to the silicon/insulator substrate interface, can be highly controlled so as to provide for a substantially perfect monocrystalline silicon epitaxial layer. In the alternative, a complex defect profile can be obtained wherein the majority of the silicon epitaxial layer is substantially defect-free and a thin portion of the silicon epitaxial layer immediately adjacent the insulator substrate contains a desired higher density of crystalline defects. This permits a very thin layer, relative to the entire silicon epitaxial layer, having a large number of crystal defects, and consequently charge carrier recombination centers, to be formed at the silicon/insulator substrate interface. The controlled density and placement of these recombination centers permits the optimization of the speed, efficiency, and radiation hardness of active devices fabricated in the silicon epitaxial layer.

BRIEF DESCRIPTION OF THE DRAWINGS

Other attendant advantages of the present invention will become apparent and readily appreciated as the same becomes better understood by reference to the following detailed description when considered in connection with the accompanying drawings, in which like reference numerals designate like parts throughout the figures and wherein:

FIG. 4 is a cross-sectional view of the composite substrate of FIG. 1 further having an amorphous buried silicon layer formed within the silicon layer, the amorphous layer being spaced apart from the insulator substrate by a relatively thin residual crystalline silicon interface layer;

FIG. 6 is a cross-sectional view of the composite substrate shown in FIG. 2 further showing a self-seeding, partially self-annealed layer propagating through a portion of the substantially amorphized buried silicon layer toward the silicon/insulator substrate interface;

DETAILED DESCRIPTION OF THE INVENTION

The present invention involves a process for providing a monocrystalline semiconductor layer on the surface of an insulator substrate to form a composite substrate that is highly desirable for use in the fabrication of high-speed integrated circuits. The process is inherently adaptable to a wide variety of semiconductor and insulator material. See, U.S. Pat. No. 3,393,088 (silicon on alpha-aluminum oxide), U.S. Pat. No. 3,414,434 (silicon on spinel insulators), U.S. Pat. No. 3,475,209 (silicon on chrysoberyl), U.S. Pat. No. 3,664,866 (IIb-VIa semiconductor compounds on insulator substrates). For the purpose of clarity in the following discussion, essentially intrinsic silicon will be used as an exemplary semiconductor material and sapphire ($Al_2O_3$) will be used as an exemplary insulator material. Accordingly, the specific embodiments described below are only representative of the many combinations of material with which the present invention can be practiced.

Figure 1:
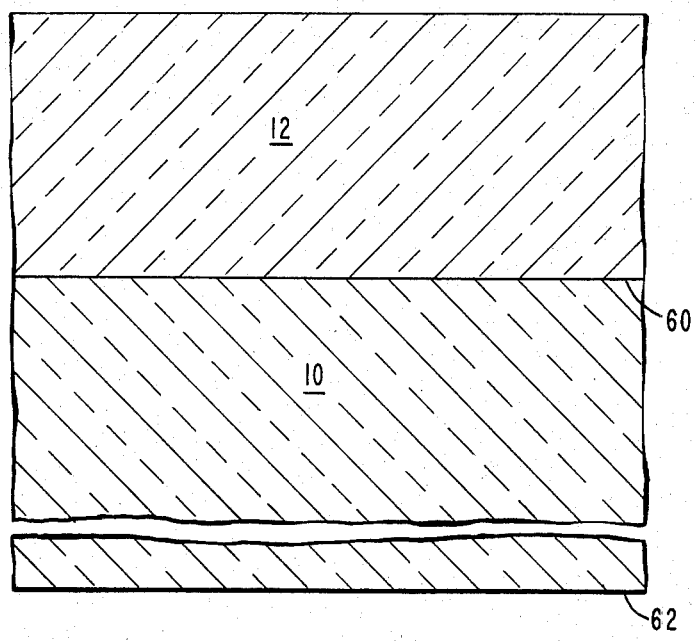
FIG. 1 is a cross-sectional view of an insulator substrate and a silicon layer epitaxially deposited on the surface thereof.

Referring now to FIG. 1, a silicon layer 12 is shown as having been epitaxially deposited on the surface of the sapphire substrate 10 to form a composite substrate 10, 12. Procedures for preparing the substrate 10 and for performing the epitaxial deposition are known in the art. See, U.S. Pat. No. 3,508,962, U.S. Pat. No. 3,546,036, and J. C. Bean et al., "Substrate and Doping Effects upon Laser-Induced Epitaxy of Amorphous Silicon", *Journal of Applied Physics*, Vol. 50, No. 2, pp. 881-885, February 1979. The sapphire substrate 10 is preferably on the order of 10-13 mils in thickness and has a surface crystallographic orientation of within 1° of ($\bar{1}$102) (hexagonal Miller indices notation). This particular crystal orientation is necessary for the subsequent epitaxial growth of a silicon layer having a crystallographic orientation of (100) (cubic Miller indices notation). The desirability of the silicon epitaxial layer 12 having a (100) surface crystallographic orientation will be described in greater detail below.

The first silicon epitaxial layer 12 is deposited on the surface of the sapphire surface 10 preferably by a chemical vapor deposition (CVD) step. The CVD growth of the epitaxial layer 12 is preferably performed by the chemical decomposition of silane ($SiH_4$) in an appropriate reactor at approximately 910° C., as measured by an incandescent pyrometer (uncorrected). The epitaxial growth is performed so as to achieve a silicon epitaxial layer preferably between 1000-2500 Å in thickness within a growth rate range of approximately 0.3-2.4 $\mu$m/min, preferably at a rate of 2.4 $\mu$m/miin. The minimum film thickness must be sufficient to provide a continuous silicon film having a substantially uniform surface so as to facilitate the further processing of the composite substrate 10, 12. The preferred minimum thickness of 1000 Å has been experimentally determined to correspond to a degree of surface pitting, resulting from defects at the silicon/sapphire interface that originate during the initial stages of the epitaxial deposition, that is sufficiently insignificant to affect the further processing of the composite substrate 10, 12. The preferred maximum thickness of 2500 Å is established for reasons described in greater detail below. The preferred epitaxial growth rate of 2.4 $\mu$m/min. is selected over slower growth rates to minimize the defect density in the silicon at the silicon/sapphire interface. Slower growth rates permit a higher concentration of defects, typically of the type referred to as microtwin defects, to form as the initial portion of the silicon layer 12 is epitaxially deposited on the sapphire surface 60.

A secondary reason for the choice of the preferred growth rate is that silicon/sapphire composite substrate fabricated in accordance with all of the above requirements, including a conventional growth rate of 2.4 $\mu$m/min., are readily available as a commercial product of the Crystal Products Division of Union Carbide, Inc., 8888 Balboa Ave, San Diego, CA 92123.

Figure 2:
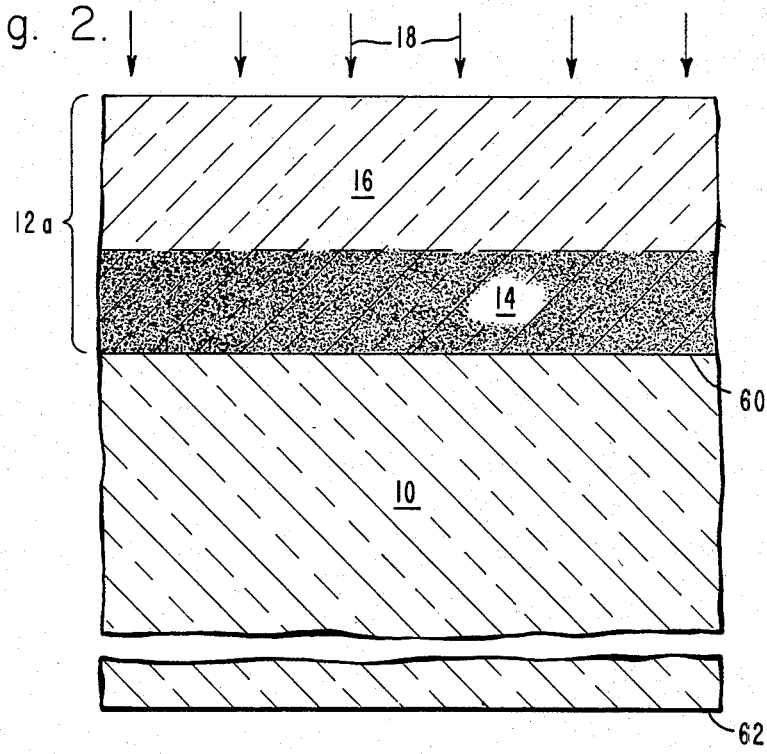
FIG. 2 is a cross-sectional view of the composite substrate shown in FIG. 1 further having a buried amorphous silicon layer formed within the silicon layer.

Referring now to FIG. 2, a first principle embodiment of the present invention, essentially equivalent to the "ideal" composite substrate, is shown. To provide this structure, an ion species 18 is implanted through the exposed surface of the silicon layer 12a so as to create a buried amorphous silicon layer 14 covered by a substantially crystalline silicon layer 16. For a silicon epitaxial layer 12a, the preferred ion species is also silicon so as to preclude the possibility of the undesirable contamination of the surface crystalline silicon layer 16. Other ion species, preferably inert and including argon and neon, may alternately be used.

Figure 3:
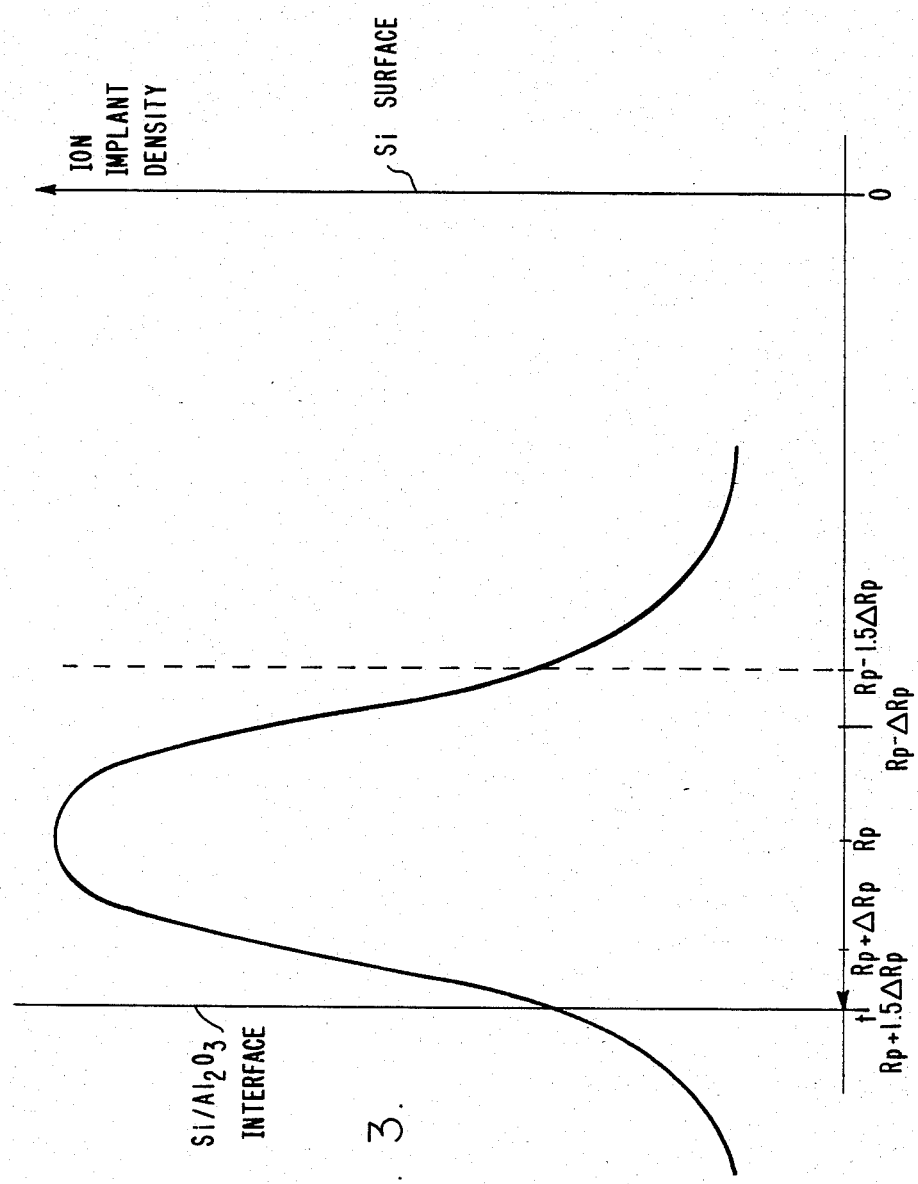
FIG. 3 is an idealized graph showing the implanted ion density versus the depth below the exposed surface of the silicon layer at which the ions are implanted and further showing the delimiting boundaries of the amorphous layer centered about Rp, one boundary being adjacent the surface of the insulator, the amorphous layer thereby corresponding to that shown in FIG. 2.

In order to closely achieve the "ideal" composite substrate, the ion implant energy must be closely controlled so that the amorphous layer 14 lies immediately adjacent the sapphire substrate 10. As shown in FIG. 3, there is a statistical distribution of the implanted ions 18 about a central maximum at a distance $R_P$ beneath the exposed surface of the silicon epitaxial layer 12a. Both $R_P$ and the standard deviation of the distribution of implanted ions about $R_P$, $\Delta R_P$, are dependent on the semiconductor material type and the ion species implanted. $R_P$ and $\Delta R_P$ are also directly proportional to the ion implanted energy, both increasing with corresponding increases in the implant energy. For silicon ions implanted at various energies into a silicon material, as well as many other combinations of common ion species and semiconductor materials, the values of $R_P$ and $\Delta R_P$ have been determined and tabulated. See, J. F. Gibbons, W. F. Johnson, S. W. Myloroie, *Projected Range Statistics*, 2 ed. Halstead Press Stroudfburg 1975. The maximum disruption of the silicon crystal lattice structure naturally occurs at $R_P$ since there is a maximum in the concentration of implanted ions at that depth beneath the exposed surface of the epitaxial layer 12a. However, a sufficient number of ions must be implanted in order to disrupt, and thereby amorphize, a portion of the silicon layer 12a substantially symmetrically distributed around $R_P$. Naturally, the width of the amorphized layer is substantially dependent on and increases with corresponding increases in the ion dose (ions/unit surface area) when implanted at a given implant energy. Increases in the implant energy widen the implanted distribution of the ions, thereby requiring higher ions doses to maintain or increase the width of the amorphized layer.

In the present invention, the implantation energy and the ion dose of a given ion species are selected so that a substantially, if not completely, amorphous layer 14 is created about $R_P$, extending from approximately $R_P - 1.5$ $\Delta R_P$ to $R_P + 1.5$ $\Delta R_P$. Implantation energies and ion doses necessary to achieve an amorphous layer 14 width of up to and exceeding approximately 3 $\Delta R_P$, consistant with the present invention, are readily obtainable. For the amorphous layer 14 to lie adjacent to sapphire substrate 10, the thickness of the initial crystalline silicon layer 12 is specified as approximately equal to $R_P + 1.5$ $\Delta R_P$.

A key aspect of the present invention, distinct from the prior art, is that the implantation energy and the ion dose are constrained such that they are sufficiently low so as not to exceed the damage density threshold of the sapphire substrate 10. The damage density of a crystalline material is herein defined as the dose of ions penetrating the surface of the crystal times the average energy of the penetrating ions. The damage density threshold for any crystalline insulator material can be determined by a known experimental process. See, M. W. Thompson, "Defects and Radiation Damage in Metals," Cambridge University Press, Cambridge, Mass., 1969. The experimentally determined damage density threshold for sapphire is approximately equal to or greater than $1 \times 10^{15}$ keV-ions/$cm^2$, estimated for the sapphire surface 60. The inherent result of exceeding the sapphire damage density threshold during the formation of the amorphous layer 14 is that the near interface 60 region of the sapphire crystal is damaged. This damage is believed to reduce a significant fraction of the sapphire 10 to the highly mobile $AlO_2$ species. As a consequence of the damaged nature of the interface region between epitaxial silicon layer 12 and the sapphire substrate 10, defect enhanced diffusion, or "gettering", occurs during the present and subsequent processing steps even though performed at low temperatures. The mobile AlO₂ out-diffusion from the sapphire substrate 10 effectively contaminates the entire epitaxial silicon layer 12a.

Consequently, a number of balancing trade-offs between the ion implantation energy, ion dose, and the thickness of the epitaxial layer 12 must be made so that a substantially amorphous layer 14 can be formed adjacent the sapphire substrate 10 without exceeding the damage density threshold of the sapphire 10. For providing an amorphous silicon layer 14 immediately adjacent the sapphire substrate 10 and without significantly exceeding the sapphire damage density threshold, the maximum silicon layer 12a thickness is approximately 2500 Å. The corresponding maximum implantation energy and ion dose are approximately $90 \pm 10$ keV and $2 \times 10^{15}$ ions/cm², respectively, which are substantially less than those prescribed by the prior art.

As an example, a composite substrate corresponding to that shown in FIG. 2 can be fabricated utilizing a 2000 Å $\pm 10\%$ thick epitaxially deposited layer on the surface of an approximately 10 mil thick sapphire substrate. Silicon ions with an energy of approximately 55 keV are implanted substantially perpendicular to the exposed surface of the epitaxial silicon surface 12a at a dose rate of approximately $1 \times 10^{12}$ ions/cm²-sec until a dose of $1 \times 10^{15}$ ions/cm² has been achieved. This ion implantation is performed while the rear surface of the sapphire substrate 10 is maintained at a constant temperature below approximately $-20°$ C. The reason for the temperature control and its particular magnitude will be discussed in greater detail below.

Referring now to FIG. 4, a second principal embodiment of the present invention is shown. This embodiment differs from that shown in FIG. 2 in that a heavily ion implanted, yet substantially crystalline, residual damaged silicon crystal interface layer 20 is provided at the silicon/sapphire interface 60 and interposed between a substantially amorphous silicon layer 22 and the sapphire substrate 10. This structure is obtained by the implantation of an ion species 26, such as silicon, into an epitaxially deposited silicon layer 12b. A surface layer 16 portion of the epitaxial layer 12b remains substantially crystalline while the majority of the epitaxial layer 12b is substantially, if not completely, amorphized due to the heavy implantation of ions. The implantation energy and dose are controlled, however, such that the thin residual layer 20 is sufficiently implanted to be amorphized.

Figure 5:
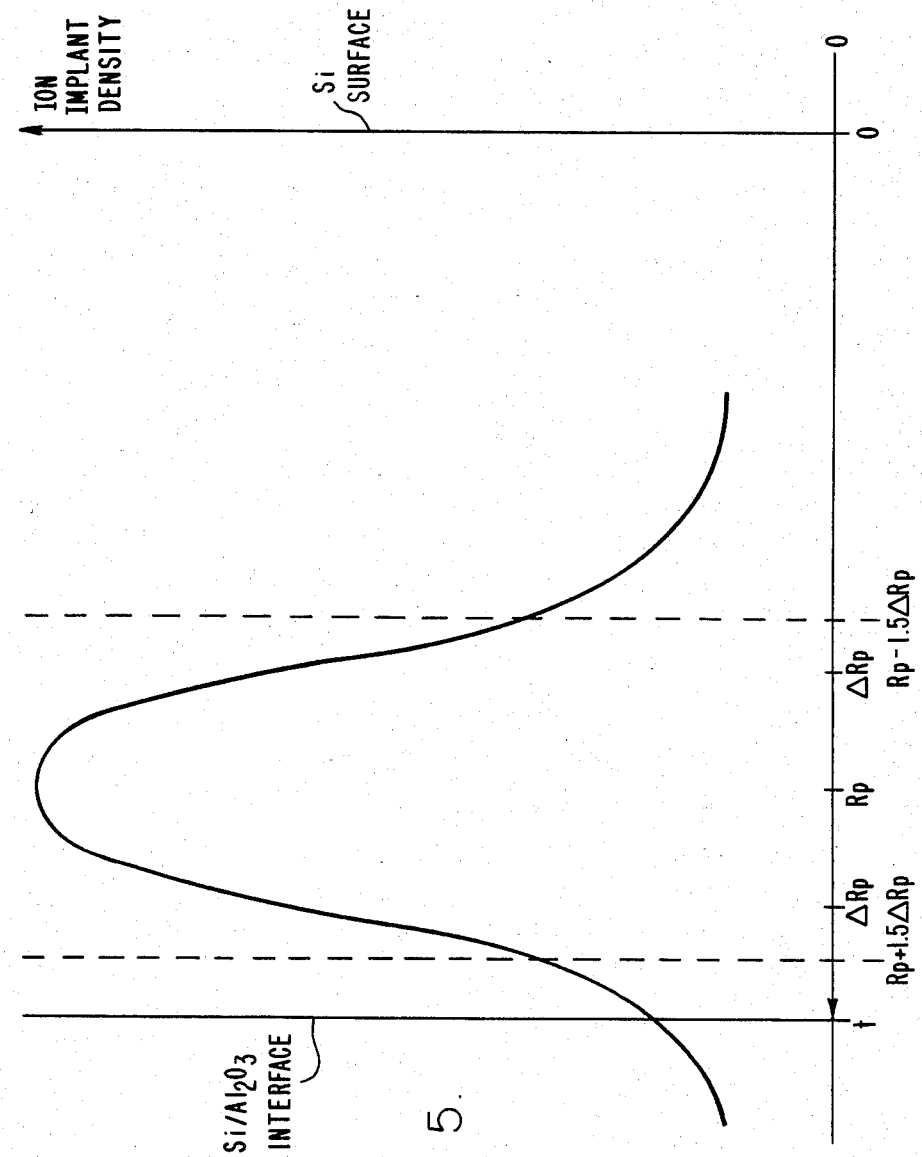
FIG. 5 is an idealized graph showing the implanted ion density versus the depth beneath the exposed silicon epitaxial layer surface at which the ions are implanted and further showing the delimiting boundaries of the amorphous layer, thereby corresponding to that shown in FIG. 4.

The implanted ion density profile, corresponding to the composite substrate shown in FIG. 4, is shown in FIG. 5. The profile is substantially symmetrically centered around a maximum implanted ion density located at depth $R_P$ below the exposed silicon layer 12b surface. With an appropriate implantation dose, the amorphous layer 22 extends from $R_P - 1.5\ \Delta R_P$ to $R_P + 1.5\ \Delta R_P$. The thickness, t, of the epitaxial silicon layer 12b is greater than $R_P + 1.5\ \Delta R_P$. Consequently, there is a thin residual silicon layer 20 that is heavily implanted, and therefore containing a substantial number of crystal defects, effectively interposed between the sapphire substrate 10 and the amorphous silicon layer 22; the layer 20 having a width of approximately $t - R_P + 1.5\ \Delta R_P$. The preferred width of the residual interface layer is approximately $200 \pm 100$ Å. Naturally, provision of this thin residual damaged interface layer 20 can be achieved by increasing the thickness, t, of the epitaxial silicon layer 12b, decreasing the ion implantation energy to reduce $R_P$, decreasing the ion dose to reduce the width of the amorphous layer 22, or by any combination of the above.

One particular consequence of providing a residual damaged interface layer 20 at the interface between the epitaxial silicon layer 12b and the sapphire substrate 10 is that the maximum epitaxial layer 12b thickness, implantation energy, and ion dose, as noted above, may all be increased, though slightly, in proportion to the thickness of the residual layer 20. Other consequences will be discussed in greater detail below.

A major modification of the structure provided by processing in accordance with either of the two principal embodiments of the present invention described above can be obtained through the use of substrate temperature control. This modification ultimately provides a partially annealed damaged silicon crystal interface layer at the silicon/sapphire interface 60. The modification, as applied to the processing of the composite substrate 10, 12 as necessary to provide the first principal embodiment of the present invention, is shown in FIG. 6. An ion species 58, preferably silicon, is ion implanted into a silicon layer 12c epitaxially deposited on the surface of a sapphire substrate 10. Throughout the ion implantation, the rear surface of the sapphire substrate 10 is maintained at a specific, highly controlled temperature. This can be accomplished by mounting the sapphire substrate 10 on a heat sink (not shown). Either a thin film of thermal paste or a thin film of silicon can be utilized to provide a high heat conductivity interface between the heat sink and the sapphire substrate 10. The use of thermal paste in this manner is well-known in the art. The use of the silicon heat conduction layer may be preferred, since the thin uniform silicon layer, relative to a thicker, non-uniform film of thermal paste, permits the composite substrate 10, 12c to be more readily and accurately oriented in subsequent processing steps, particularly the ion implantation. Since the silicon layer has a high thermal conductivity coefficient, the silicon heat sink interface layer may be of any convenient thickness. Further, this interface layer can be epitaxially deposited on the rear surface of the sapphire substrate at any convenient time prior to the epitaxial deposition of the silicon layer 12 on the opposing surface of the sapphire substrate 10, since the heat sink interface layer is relatively tolerant of low level contamination.

During the ion implantation, the temperature of the silicon layer 12c rises substantially, relative to the rear surface of the substrate 10, in response to the absorption of the ion implant energy. Due to the thinness of the silicon layer 12c and the inherent high thermal conductivity of silicon, the temperature throughout the silicon layer 12c can be considered essentially uniform. The relatively lower thermal conductivity of the sapphire substrate, along with its much greater relative thickness, results in a substantial thermal gradient (typically 150°–200° C.) occurring across the sapphire substrate 10, increasing from the rear substrate surface 62 to the silicon/sapphire interface 60. The temperature of the silicon layer 12c can be altered by modifying the implantation energy or the ion dose, or both, of the implanted ion species 58 so as to modify the magnitude of the energy provided to the silicon layer 12c. This can be further accomplished by modifying the ion dose rate, thereby changing the rate at which energy is provided to the silicon layer 12c. Alternatively, by adjusting the controlled temperature of the heat sink (not shown) and, correspondingly, the rear surface of the sapphire substrate 10, the temperature of the silicon layer 12c can be altered.

The elevated temperature of the silicon layer 12c permits a partially annealed silicon interface layer to be formed at the silicon/sapphire interface 60. As shown in FIG. 6, a thin self-annealing layer 30, containing a large number of crystalline defects, i.e., damaged, forms within the portion of the epitaxial silicon layer 12c that is to be amorphized. During the initial stages of the ion implantation, the maximum disruption of the crystal lattice and the initial, localized heating occur at a depth of $R_P$ beneath the exposed surface of the silicon layer 12c. Provided that the heating is sufficient to raise the temperature of the silicon atoms at a depth of approximately $R_P$ to an average temperature of approximately 150° C. or greater, partial annealing of the silicon crystal lattice will occur above and below $R_P$. The thin self-annealing layer 30 below $R_P$ will effectively propagate toward the silicon/sapphire interface 60. This occurs as the silicon layer 32 below the self-annealing layer 30 is increasingly damaged by the implantation of ions to the point of being pseudo-amorphous. The self-annealing layer 30 acts as a nucleation seed for the pseudo-amorphous layer 32 such that the lower boundary of the self-annealing layer 30 effectively grows toward the silicon/sapphire interface 60. The upper boundary of the self-annealing layer 30 also propagates toward the silicon/sapphire interface 60. This regression of the upper boundary is due to the continued implantation of ions symmetrically distributed about $R_P$, thus continuously disrupting the self-annealing layer 30 particularly at its upper boundary, thereby progressively reamphorizing the partially annealed silicon crystal. Consequently, the thin self-annealing interface layer 30 propagates through a portion of the eventually buried amorphous layer 14a until it reaches either the silicon/sapphire interface 60 or a substantially crystalline layer, such as a residual interface layer 20, and stabilizes at a constant width.

The self-annealing layer formed immediately above $R_P$ is now shown in FIG. 6, since the layer is typically completely re-amorphized prior to reaching the crystal/amorphous silicon interface 64 between the remaining silicon crystal layer 16 and the amorphous silicon layer 28. The complete re-amorphization of this upper annealed layer results from the fact that it receives a greater flux of implanted ions, thereby substantially failing to grow at the rate at which the self-annealing layer is re-amorphized.

The implantation energy, ion dose, ion dose rate, and heat sink temperature must be balanced in order to ensure the formation and proper propagation of the self-annealing silicon interface layer 30. In order to ultimately provide for a partially annealed interface layer 30 adjacent the silicon/sapphire interface 60 having a preferred thickness of 200±100 Å, an ion implantation step performed on a composite substrate 10, 12 and otherwise identical to that required for providing the first principal embodiment of the present invention described above, must achieve the preferred conditions (consistant with the example given above) of an implant energy of 55 keV providing an ion dose of $1 \times 10^{15}$ ions/cm$^2$ at a rate of $1 \times 10^{12}$ ions/cm$^2$-sec while maintaining the heat sink at a constant temperature of approximately 23° C. Thinner, less distinct annealed interface layers may be obtained by decreasing the heat sink temperature until, at an approximate temperature of −20° C., essentially no annealed interface layer 30 will be realized. Conversely, heat sink temperatures above approximately 250° C. will result in no amorphous layer 14b being ultimately formed due to extremely accelerated self-annealing.

Alternately, a second ion implantation step can be performed to provide a partially self-annealed layer 30. Beginning with a composite substrate 10, 12 formed in accordance with either principal embodiment of the present invention, the ion implantation substrate temperature maintained sufficiently low to preclude the formation of an self-annealing layer 30, a second ion implantation is performed utilizing a low mass ion species, such as hydrogen. The implantation energy and ion dose are adjusted so as to provide sufficient localized heating within the amorphous layer 14 (FIG. 2), 22 (FIG. 4) for a substantially uniform layer to partially anneal. Since a low mass ion is used, there is substantially no disruption of the partially annealed layer as it forms, the layer forms and substantially remains at a depth $R_P$ beneath the surface of the silicon layer 12. Thus, the partially annealed layer anywhere within the amorphous layer 14 (FIG. 2), 22 (FIG. 4), though preferably at the silicon/sapphire interface 60 (first principal embodiment) or at the interface between the amorphous layer 22 and the residual damaged interface layer 20. However, in all cases, the implantation energy and ion dose must be limited so as not to exceed the damage density threshold of the sapphire substrate 10.

Figure 7:
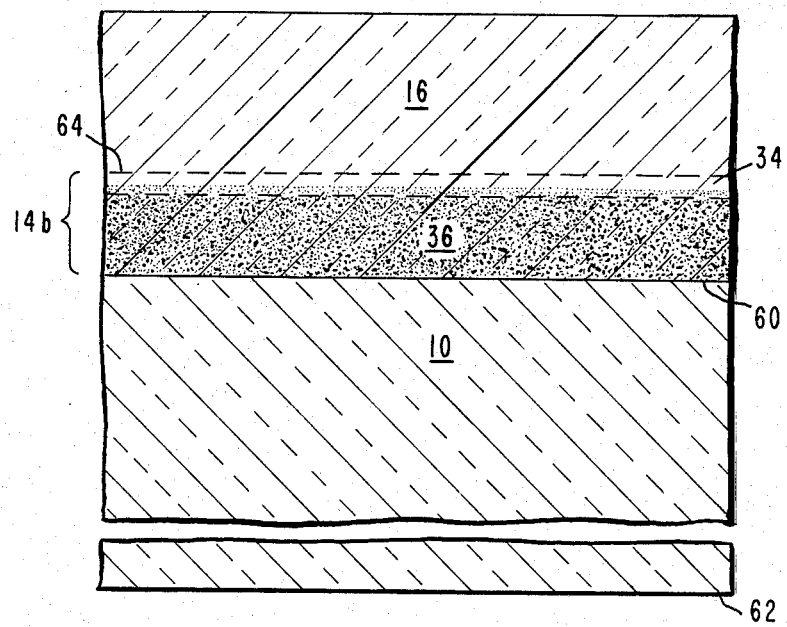
FIG. 7 is a cross-sectional view of the composite substrate shown in FIG. 2 further showing the initial anneal/regrowth of the buried amorphous silicon layer utilizing the crystalline silicon surface layer as a nucleation seed for the regrowth.
Figure 8:
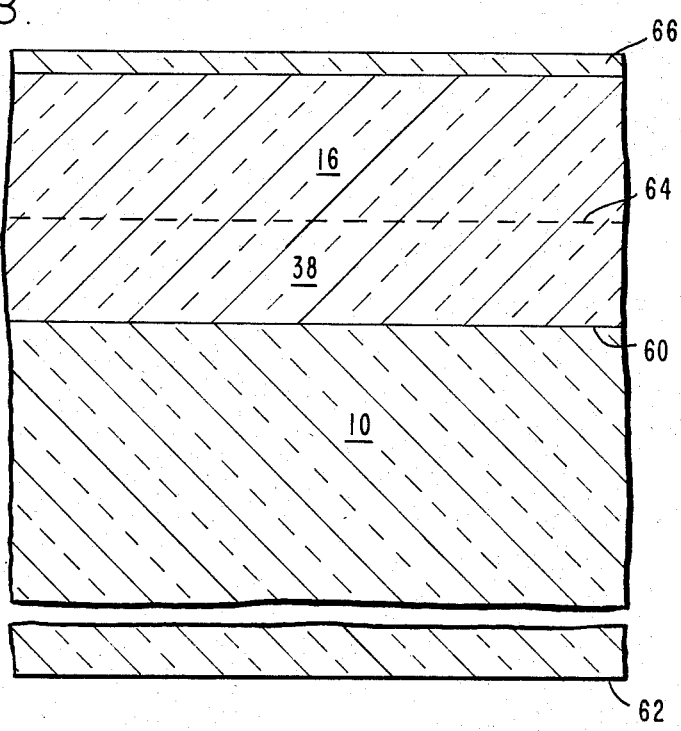
FIG. 8 is a cross-sectional view of the composite substrate showing the completely regrown buried silicon layer.

Once the desired ion implantation step has been completed, pursuant to either of the principal embodiments of the present invention and the optional modification thereof as discussed above, the buried amorphous layer is annealed utilizing a two-step heat treatment process. As shown in FIG. 7, the first step is performed at a temperature sufficient for the initial amorphous silicon layer 14b to begin nucleation only at the crystal/amorphous silicon interface 64 (temperatures typically in the range of 500° to 900° C.). For purposes of clarity, neither a residual damaged layer 20 or partially annealed 30 interface layer is shown in FIGS. 7–8. The use of a common nucleation source is required for the regrowth of the amorphous layer 14b to occur such that the resulting silicon crystal has a common crystallographic orientation. Annealing at temperatures sufficient for spontaneous nucleation within the bulk of the amorphous layer 14b are naturally to be avoided. Crystal regrowth progresses through the remaining amorphous silicon layer 36, leaving behind a relatively defect-free crystal silicon layer 34, typically until the regrowth crystal/amorphous silicon interface reaches the silicon/sapphire interface 60. The regrowth crystal layer 34 is substantially defect-free as the intended consequence of the choice of the crystallographic orientation of the initial epitaxial silicon layer 12. Inherent in the epitaxial deposition of a silicon layer onto a sapphire substrate having a ($1\bar{1}02$) crystallographic orientation is that the silicon growth is in the (100) direction. Thus, the subsequent regrowth of the crystal silicon layer 34 is also essentially in the (100) direction. The silicon/sapphire interface defects, and the residual defects propagating from the interface defects into the silicon layer 12, however, primarily have a (111) crystallographic orientation. Since defects not having the same crystallographic orientation as the crystal growth inherently propagate at the nucleation regrowth interface, typically at an order of magnitude less than the speed of the crystal regrowth, these defects can be effectively "outgrown". Consequently, as the regrowth interface between the recrystallized silicon layer 34 and the amorphous silicon layer 36 propagates away from the original crystal/amorphous silicon interface 64, the regrown crystal quickly becomes essentially defect-free. Naturally, if either a residual damaged interface layer 20, as provided for by the second principal embodiment of the present invention, or an annealed damaged interface layer 30, as provided by the modification of either of the two principal embodiments of the present invention, or both, are present, then the propagation of the crystal/amorphous silicon interface will halt once those layers are reached. Obviously, only amorphous silicon is recrystallized. The recrystallization anneal requires from 30 min. to 3 hours.

Once recrystallization is complete, a second thermal annealing step is performed. Temperatures of up to approximately 910° C. can be used since there is no danger of initiating any random nucleation of any amorphous silicon. Further, since the surface of the sapphire substrate 10 is undamaged, there is no danger of contaminating the silicon layer 16, 38 with substrate originated contaminants. This high temperature anneal is performed for a short period of time, for up to 1 hour, principally to remove any defects that may have occurred at the original crystal silicon/amorphous silicon interface 64 in the earliest stages of the crystal regrowth. Also, defects in the residual damaged interface layer 20 and the partially annealed interface layer 30, if either is present, are uniformly reduced to a desired density but not completely eliminated. This allows the desired defect density profile to be established.

For the above-given example, the initial annealing step for the recrystallization of the amorphous layer 14b is preferably performed at 600° C. for three hours in a nitrogen ambient. The second annealing step is preferably performed at a temperature of 850° C. for one hour, also in a nitrogen ambient. Naturally, however, neither of the annealing steps should be at a temperature sufficient to result in the thermally induced incursion of aluminum contaminants into the silicon layers.

At this point, the composite substrate comprises of an essentially defect-free crystalline silicon layer 38 interposed between the sapphire substrate 10 and the original crystalline layer 16 of the initial epitaxial layer 12, as shown in FIG. 8. Due to the handling of the composite substrate between process steps, a relatively thin contaminant layer 66 may exist at the otherwise exposed surface of the silicon crystal layer 16. This contaminant layer 66 is removed utilizing conventional processing techniques including, preferably, etching the contaminated surface of the composite substrate in a 50-50 mixture, by volume, of $H_2SO_4$ and HF.

Figure 9:
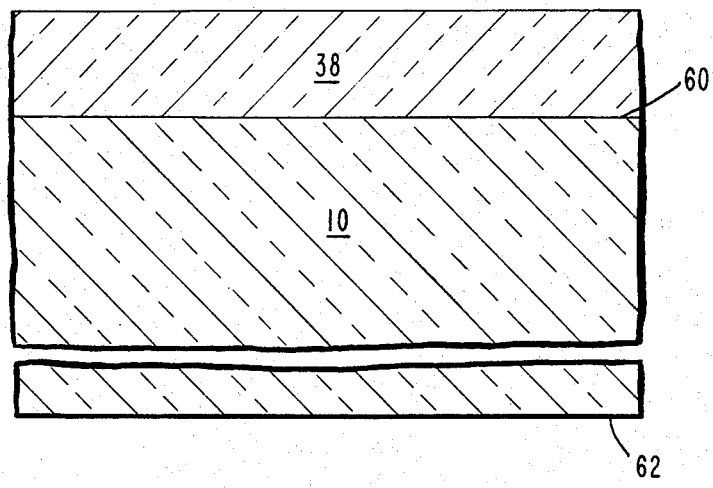
FIG. 9 is a cross-sectional view of the composite substrate of FIG. 8 after the seed surface crystal silicon layer has been removed leaving the regrown crystalline silicon layer adjacent the insulator substrate.

The remaining original crystalline silicon layer 16 is then removed to leave a composite substrate consisting of the regrown crystal silicon layer 38 adjacent the sapphire substrate 10, as shown in FIG. 9. Naturally, any annealed interface layer or residual damaged interface layer as provided during the earlier ion implatation processing, would be interposed between the regrown crystal silicon layer 38 and the sapphire substrate 10. For purposes of clarity, these layers are not shown in FIGS. 9-10.

Preferably, the remaining crystalline silicon layer 16 is removed by reactively processing the composite substrate 10, 38, 16, in an $H_2$ ambient flowing at a rate of 100 liters per minute for approximately two hours while maintaining the system at a temperature of approximately 910° C. By performing this step in a CVD reactor, the next step of epitaxially depositing a silicon layer onto the exposed surface of the regrown silicon crystal layer 38 can be performed without further handling the composite substrate 10, 38.

Figure 10:
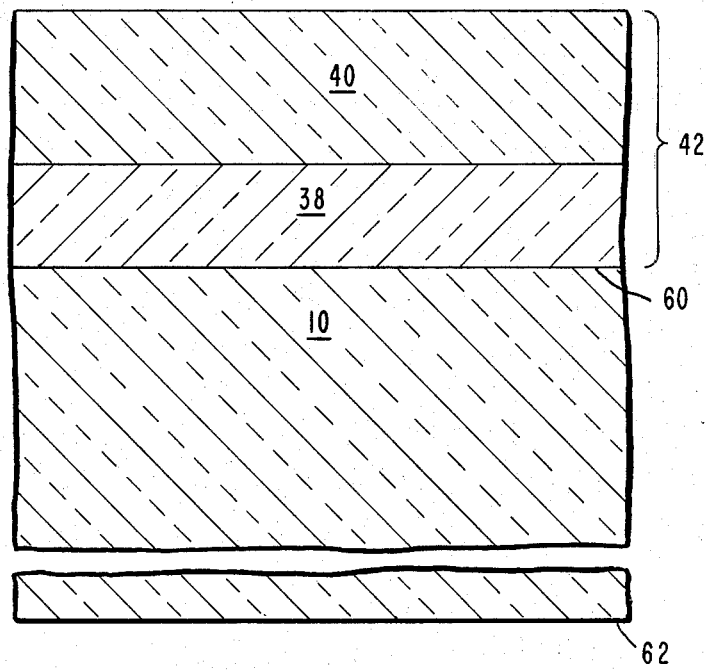
FIG. 10 is a cross-sectional view of the completed composite substrate including a second silicon layer epitaxially deposited on the surface of the regrown crystalline silicon layer.

As shown in FIG. 10, an epitaxial layer 40 is deposited on the regrown crystal silicon layer 38 so as to form an essentially uniform silicon layer 42 adjacent the sapphire substrate 10. The second epitaxial silicon layer 40 can be deposited so that the full silicon layer 42 has any desired thickness. Naturally, any conventional method of providing the silicon epitaxial layer 40 can be utilized. However, consistent with the desire not to incur any unnecessary handling of the composite substrate 10, 38, the epitaxial deposition of the silicon layer 40 is preferably accomplished by the chemical decomposition of a silane mixture over the composite substrate 10, 38 in a CVD reactor. Silane introduced into the reactor at a flow rate of 100 sccm (standard $cm^3$/min), wherein the composite substrate is maintained at 910° C., results in an epitaxial silicon growth rate of approximately 2.4 $\mu$m/min. The epitaxial deposition is continued until the desired silicon layer 42 thickness is achieved, preferably around 5000 Å.

Figure 11:
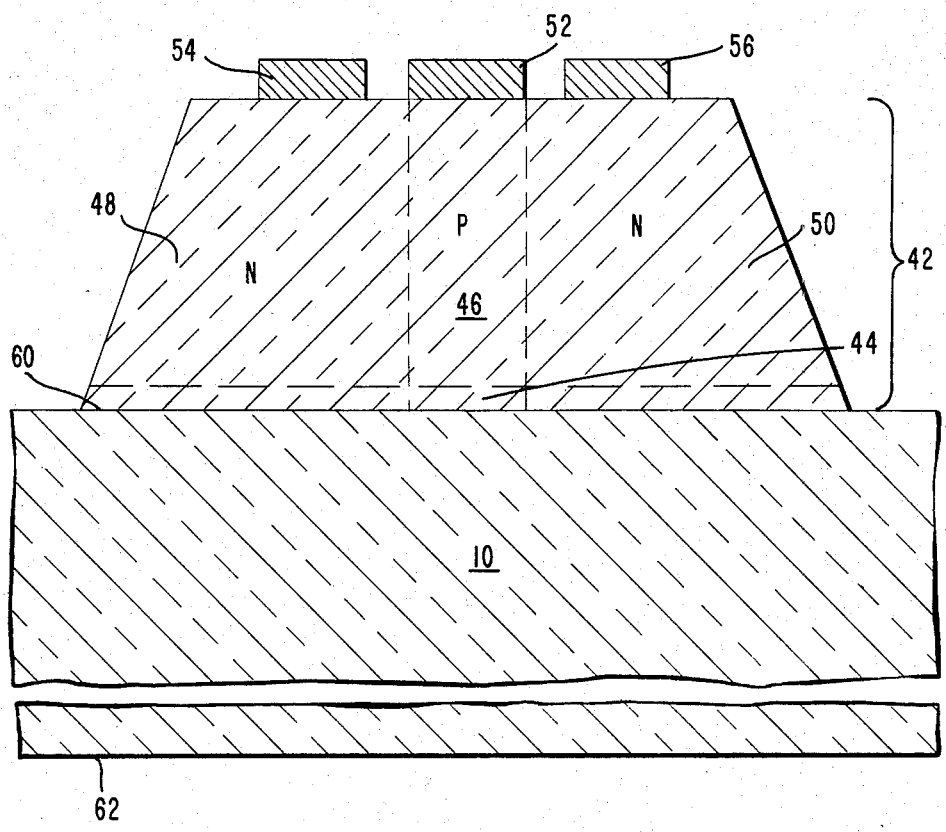
FIG. 11 is a cross-sectional view of an idealized active device, such as a MESFET, fabricated on an island portion of the silicon layer, a thin partially annealed or residual damaged silicon interface layer being adjacent the insulator substrate.

At this point, the formation of the composite substrate 10, 42 is essentially complete, the composite substrate 10, 42 being ready for the further fabrication of active devices in the silicon layer 42 thereof. As shown in FIG. 11, this can be accomplished by standard processing steps providing for the ion implantation of source and drain regions 48, 50 (shown as n-type), separated by a gate region 46 (shown as p-type), into the silicon layer 42. Aluminum or refractory metal contacts 52, 54, 56 are provided at the surface of the respective gate 46, source 48, and drain 50 regions, thereby forming, for example, a conventional MESFET. Portions of the silicon layer 42 are etched away so as to expose the sapphire substrate 10 surrounding the active device so as to form an island and, thereby, effectively isolate the device from all other devices fabricated in the silicon layer 42.

Also shown in FIG. 11 is an interface layer 44. This layer 44 may be either a residual damaged interface layer or an annealed interface layer, as provided for during the ion implantation steps described above. The interface layer 44 may also include both an annealed interface layer and a residual damaged interface layer adjacent one another, the residual damaged interface layer being further adjacent the sapphire substrate 10. For reasons discussed in greater detail immediately below, it may be highly desirable to provide either one or both of the interface layers in the completed composite substrate 10, 42.

A first basic reason for including at least one interface layer within the gate region of a FET device, the layer having a high defect density relative to the majority of the gate region material, is to prevent a phenomena known as charge pumping. In the operation of a FET active device, inversion regions within the gate material are periodically induced to switch the device between conducting and non-conducting states. In order for the device to operate successfully at high speeds, two conditions must be met. One is that the charge carriers must have a high mobility through the gate region of the active device so that the initiation of the conducting state is not current-limited. This, in turn, implies that the charge carriers must have long lifetimes between generation and recombination. An inherent quality of an essentially defect-free semiconductor crystalline materials, such as silicon, is that charge carriers therein will exhibit high mobility and, therefore, long lifetimes.

The other requirement is that at the conclusion of the conducting state of the active device, the charge carriers within the guide region must quickly recombine. Should the lifetime of charge carriers within the gate region of the active device be comparable to the operating frequency of the device, as accumulation of charge carriers within the gate region will result. This, in turn, will cause the operating parameters of the active device to change dramatically as a function of frequency and, potentially, prevent the device from switching to a nonconducting state. This accumulation of charge carriers within the gate region is typically known as charge pumping.

The provision of a high defect density region within, at least, the gate region of the active device will effectively prevent charge pumping. Defects in the crystal of a semiconductor material effectively decrease both the mobility and lifetime of charge carriers by essentially acting as scattering and recombination centers. By providing that the high density defect region within the gate region occupies only a fraction of the total gate region, the conducting state charge carrier mobility is effectively unchanged. However, the high defect density region within the gate, even though quite small, is sufficient to preclude charge pumping by causing charge carriers to recombine faster than they accumulate. Thus, providing an interface layer 44 having a high density of defects, thereby acting as the desired high defect density region, permits the high speed operation of the active device to be optimized.

A second basic reason for including the high defect density layer 44 is to increase the radiation hardness of the integrated circuits fabricated on the composite substrate 10, 42. A principal result of exposure of an integrated circuit to radiation is the spurious generation of charge carriers within the silicon layer 12. The radiation generated charge carriers, in turn, may substantially interfere with the intended operation of the active devices of the integrated circuit depending upon the intensity of the radiation and, therefore, the number of charge carriers generated. The radiation generated charge carriers tend to accumulate at the silicon/sapphire interface 60. Consequently, the provision of a continuous interface layer 44 having a high defect density at the silicon/sapphire interface 60, thereby underlying each respective active device of the integrated circuit, will increase the tolerance, or hardness, of the integrated circuit to radiation. The crystal defects, acting again as recombination centers, substantially increase the rate at which the radiation generated charge carriers recombine, thereby limiting their interference with the intended operation of the active devices.

A third basic reason for providing a high defect density silicon layer, at least within the gate region of the active devices, is to prevent a phenomena known as back-channel leakage. Inherent in the juxtaposition of two dissimilar crystalline materials is the creation of a voltage potential across the interface. This voltage potential is essentially the consequence of trapped charges at the interface. Additional trapped charges within the bulk of the sapphire substrate 10 may also be generated by exposure to radiation. These bulk trapped charges only increase the voltage potential across the interface. This voltage potential, though small, effectively induces a thin inversion layer at the silicon/sapphire interface 60 between the source and drain regions 48, 50 of the active device. The current conducted by this inversion layer is commonly referred to as back-channel leakage. Since the inversion inducing charge carriers are trapped at the silicon/sapphire interface 60, some minimum inversion layer is essentially permanent. However, the leakage current can be effectively reduced by substantially decreasing the mobility of the charge carriers through the inversion layer. As before, this can be accomplished by providing a thin high defect density region, such as the interface layer 44, at the silicon/sapphire interface 60. The thickness of the interface layer 44 need be no more than the thickness of the back-channel inversion layer. The crystal defects essentially act as scattering centers and, thereby, effectively reduce the net back-channel leakage current flowing between the source and drain regions 48, 50 of the active device.

Concurrent considerations regarding the proper selection of the size, placement, and the particular defect density of the interface layer 44, as desirable for the reasons given above, involve the necessity of ensuring the accurate, high yield fabrication of high-speed active devices a having minimum of junction leakage currents. Considering that the fabrication of an active device primarily involves the exposed surface of the silicon layer 42, the desired high defect density region preferably should be located as far away from the exposed surface of the silicon layer 42 as possible. Placement of the high defect density interface layer 44 at the silicon/sapphire interface 60 optimally results in the layer 44 neither interferring with the further fabrication of the active device or being significantly affected thereby.

In order to minimize junction leakage currents, the high defect density interface layer 44 is preferably made as thin as possible, with as high a defect density as necessary to provide a desired number of recombination centers. Particularly, since the defects act as recombination centers, a leakage current will flow across a reverse biased p-n junction, as may exist between either the source 48 and gate 46 regions or the drain 50 and gate 46 regions of the active device. This leakage current is, therefore, directly proportional to the p-n junction area within the high defect density interface layer 44. Thus, the thickness and correspondingly, the junction area of the interface layer 44, should be kept as small as possible, the layer 44 preferably having a thickness on the order of approximately 200 Å.

Thus, a process of fabricating semiconductor-on-insulator composite substrates having a highly controlled semiconductor defect density profile has been disclosed.

Obviously, many modifications and variations of the present invention are possible in light of the above description of the preferred embodiments. These modifications may include changes in the specific semiconductor and insulator materials used, the specific conductivity type of the semiconductor layer, the specific ion species, ion dose and dose rate, the implantation energy, and the processing times and temperatures employed within the limits disclosed herein. Further, the specific conventional and well-known processing steps, including the preparation of the various materials and the expitaxial deposition of the semiconductor material onto the insulator material have not been described in detail in order not to obscure the present process. It is therefore to be understood, that within the scope of the appended claims, the invention may be practiced otherwise than as specifically described above.

What is claimed is:

1. A method of fabricating a composite semiconductor/insulator substrate comprising the steps of:
   (a) providing a thin layer of semiconductor material adjacent a surface of an insulator, said insulator having a given damage density threshold;
   (b) implanting a given ion species into said thin semiconductor layer at an implant energy and dosage sufficient to amorphize a buried layer portion of said semiconductor layer, the average residual implant energy at the surface of said insulator being sufficiently low such that the product of the residual energy and dosage of those ions that pass into said insulator is less than the damage density threshold of said insulator; and
   (c) regrowing said amorphous buried layer so as to form a recrystallized buried layer using the unamorphized portion of said thin semiconductor layer as a crystallization seed.

2. The method of claim 1 wherein said thin semiconductor layer is equal to or less than approximately 0.5 micrometers thick.

3. The method of claim 2 wherein the implantation step is further characterized as forming said amorphous buried layer adjacent the surface of said insulator.

4. The method of claim 2 wherein the implantation step is further characterized as forming said amorphous buried layer spaced apart from the surface of said insulator by a thin residual interface layer having an ion implantation enhanced density of semiconductor crystal lattice defects.

5. The method of claim 2 wherein the implantation step includes the step of heating said insulator during the implantation of said ions so as to maintain the interface between said thin semiconductor layer and said insulator at a given temperature so that a concurrently self-annealing layer forms during the implantation step and effectively migrates to the boundary of the buried amorphous layer closest to said insulator, whereby a partially annealed, high defect density semiconductor layer is provided within said thin semiconductor layer.

6. The method of claims 1, 2, 3, 4, or 5 further comprising the steps of:
   (a) removing at least a portion of said semiconductor layer to expose a corresponding portion of said recrystallized buried layer; and
   (b) providing an additional layer of said semiconductor material adjacent said recrystallized buried layer, said additional semiconductor layer being substantially free of crystal lattice defects.

7. The method of claim 6 further characterized in that said insulator is sapphire and that the damage density threshold therefore is approximately $1 \times 10^{15}$ keV ions/cm$^2$.

8. The method of claim 7 further characterized in that the ion implantation energy is less than or equal to 90 keV.

9. The method of claim 8 further characterized in that the implanted ion dosage is equal to or less than $2 \times 10^{15}$ ions/cm$^2$.

10. The method of claim 9 further characterized in that said thin semiconductor layer is equal to or less than approximately 0.25 micrometers thick.

11. The method of claim 10 further characterized in that said semiconductor material and said ion species are silicon.

12. The method of claim 10 further characterized in that said ion species is of the same element or an element component of said semiconductor material.

13. The method of claim 12 further characterized in that said semiconductor material is GaAs and said ion species is arsenic.

14. A method of fabricating a plurality of FET devices on a composite substrate which includes forming source, drain, and gate regions in said substrate and making electrical contact thereto, the formation of said composite substrate being comprised of the steps of:
   (a) forming a crystal layer of a semiconductor material on a substrate of an insulator material;
   (b) implanting a given ion species into said semiconductor crystal layer under such conditions that the implanted ions penetrating through said semiconductor crystal layer and into said insulator substrate, at their respective residual energies, are insufficient to significantly damage said insulator substrate such that substrate-originated contaminants are released into said semiconductor layer, a sufficient density of said implanted ions being implanted into said semiconductor crystal layer so as to amorphize a buried layer of said semiconductor crystal layer; and
   (c) annealing said semiconductor material at a given temperature so as to recrystallize said buried layer, said given temperature being appropriate for the remaining portion of said semiconductor crystal layer to act as the primary nucleation seed for the recrystallization of said buried amorphous layer.

15. A method of fabricating a silicon-on-sapphire composite substrate suitable for use in the further fabrication of high-speed integrated circuits, the method comprising the steps of:
   (a) forming a crystal silicon layer of a given thickness on the surface of a sapphire substrate;
   (b) implanting a given dose of silicon ions, at a given energy, into said crystal silicon layer so as to amorphize a buried layer of said crystal silicon layer, the number of said silicon ions passing through said crystal silicon layer and into said sapphire substrate, at their respective residual energies, being insufficient to damage said sapphire substrate such that significant quantities of aluminum out-diffuse from said insulator substrate and into said buried amorphous silicon layer and the remaining portion of said crystal silicon layer; and
   (c) regrowing said buried amorphous silicon layer to form a buried recrystallized silicon layer, the remaining portion of said crystal silicon layer acting as the regrowth nucleation seed for said buried amorphous layer such that said buried recrystallized silicon layer has a common crystallographic orientation and, further, is substantially free of crystal lattice defects.

16. The method of claim 15 wherein the step of implanting said silicon ions is further characterized in that said given thickness of said crystal silicon layer, said ion dose, and said given ion implant energy are such that the product of the number of ions penetrating into said sapphire substrate and the average of their respective residual energies, upon penetration, is less than or equal to $1 \times 10^{15}$ keV-ions/cm$^2$.

17. The method of claim 15 or 16 wherein the step of implanting said silicon ions is further characterized in that said given thickness, said ion dose, and said implantation energy are such that said buried amorphous silicon layer is formed adjacent said sapphire substrate.

18. The method of claim 15 or 16 wherein the step of implanting said silicon ions is further characterized in that said given thickness, said ion dose, and said implantation energy are such that said buried amorphous silicon layer is formed within said silicon crystal layer spaced apart from said sapphire substrate by a residual, damaged silicon crystal layer having a substantial density of crystal lattice defects.

19. The method of claim 17 wherein the step of implanting said silicon ions is further characterized in that said given thickness, said ion dose, said implantation energy, the rate at which said silicon ions are implanted, and the temperature of said sapphire substrate are such that a partially annealed silicon crystal layer, having a substantial density of crystal lattice defects, is formed at the boundary of said buried amorphous silicon layer closest to said sapphire substrate.

20. The method of claim 18 wherein the step of implanting said silicon ions is further characterized in that said given thickness, said ion dose, said implantation energy, the rate at which said silicon ions are implanted, and the temperature of said sapphire substrate are such that a partially annealed silicon crystal layer, having a substantial density of crystal lattice defects, is formed at the boundary of said buried amorphous silicon layer closest to said sapphire substrate.

21. The method of claim 18 further comprising the step of annealing said composite substrate such that the crystal lattice defects within said buried recrystallized silicon layer are substantially eliminated and the defect density within said residual, damaged silicon crystal layer are reduced to a desired density.

22. The method of claim 19 further comprising the step of annealing said composite substrate such that the crystal lattice defects within said buried recrystallized silicon layer are substantially eliminated and the defect density within said partially annealed silicon crystal layer are reduced to a desired density.

23. The method of claim 20 further comprising the step of annealing said composite substrate such that the crystal lattice defects within said buried recrystallized silicon layer are substantially eliminated and the defect density within said residual, damaged silicon crystal layer and said partially annealed silicon crystal layer are reduced to a desired density.

* * * * *